(12) United States Patent
Lou et al.

(10) Patent No.: US 7,719,026 B2
(45) Date of Patent: May 18, 2010

(54) UN-ASSISTED, LOW-TRIGGER AND HIGH-HOLDING VOLTAGE SCR

(75) Inventors: Lifang Lou, Orlando, FL (US); Jay R. Chapin, South Portland, ME (US); Donna Robinson-Hahn, Center Valley, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 219 days.

(21) Appl. No.: 12/098,546

(22) Filed: Apr. 7, 2008

(65) Prior Publication Data

US 2008/0253046 A1 Oct. 16, 2008

Related U.S. Application Data

(60) Provisional application No. 60/911,133, filed on Apr. 11, 2007.

(51) Int. Cl.
*H01L 29/74* (2006.01)
(52) U.S. Cl. ............... 257/173; 257/175; 257/E29.222; 257/E29.337; 438/133; 438/140
(58) Field of Classification Search ................ 257/173, 257/175, E29.222, E29.337; 438/133, 140
See application file for complete search history.

(56) References Cited

U.S. PATENT DOCUMENTS

| 6,172,404 | B1 | 1/2001 | Chen et al. |
| 7,071,528 | B2 | 7/2006 | Ker et al. |
| 7,202,114 | B2 | 4/2007 | Salcedo et al. |
| 7,491,584 | B2 * | 2/2009 | Yu et al. .................... 438/128 |
| 2006/0151836 | A1 | 7/2006 | Salcedo et al. |

* cited by examiner

*Primary Examiner*—Tu-Tu V Ho
(74) *Attorney, Agent, or Firm*—Cesari and McKenna, LLP; Edwin H. Paul, Esq.

(57) ABSTRACT

A protective SCR integrated circuit device is disclosed built on adjacent N and P wells and defining an anode and a cathode. In addition to the anode and cathode contact structures, the device has an n-type stack (N+/ESD) structure bridging the N-Well and the P-Well, and a p-type stack (P+/PLDD) structure in the P-Well. The separation of the n-type stack structure and the p-type stack structure provides a low triggering voltage without involving any external circuitry or terminal, that together with other physical dimensions and processing parameters also provide a relatively high holding voltage without sacrificing the ESD protection robustness. In an embodiment, the triggering voltage may be about 8V while exhibiting a holding voltage, that may be controlled by the lateral dimension of the n-type stack of about 5-7 V.

10 Claims, 7 Drawing Sheets

| | D1 | D2 | D3 | D4 | D5 | D6 | D7 | D8 | D9 | Lx | Lp | Ln |
|---|---|---|---|---|---|---|---|---|---|---|---|---|
| 1.6 | 1.6 | 0.95 | 1.6 | 0.95 | 3.2 | 1.6 | 0.95 | 1.6 | 0.6 | 1 | 0 | 0 |
| 1.6 | 1.6 | 0.95 | 1.6 | 0.95 | 3.2 | 1.6 | 0.95 | 1.6 | 0.6 | 1 | 0.3 | 0.3 |
| 1.6 | 1.6 | 0.95 | 1.6 | 0.95 | 3.2 | 1.6 | 0.95 | 1.6 | 0.6 | 1 | 0.5 | 0.5 |
| 1.6 | 1.6 | 0.95 | 1.6 | 0.95 | 3.2 | 1.6 | 0.95 | 1.6 | 0.6 | 1 | 0.8 | 0.8 |

| | D1 | D2 | D3 | D4 | D5 | D6 | D7 | D8 | D9 | Lx | Lp | Ln |
|---|---|---|---|---|---|---|---|---|---|---|---|---|
| 3.2 | 1.6 | 0.95 | 1.6 | 0.95 | 3.2 | 1.6 | 0.95 | 1.6 | 0.6 | 1 | 0.5 | 0.5 |
| 3.2 | 1.6 | 0.95 | 1.6 | 0.95 | 4.8 | 1.6 | 0.95 | 1.6 | 0.6 | 1 | 0.5 | 0.5 |
| 3.2 | 1.6 | 0.95 | 1.6 | 0.95 | 6.4 | 1.6 | 0.95 | 1.6 | 0.6 | 1 | 0.5 | 0.5 |
| 3.2 | 1.6 | 0.95 | 1.6 | 0.95 | 8 | 1.6 | 0.95 | 1.6 | 0.6 | 1 | 0.5 | 0.5 |

| | DOPANT | |
|---|---|---|
| PWELL | B+ | 6.00E+12 |
| NWELL | P+ | 7.30E+12 |
| ESD | AS+ | 5.00E+14 |
| NLDD | P+ | 4.00E+13 |
| PLDD | BF2+ | 4.00E+13 |
| N+ | AS+ | 1.14E+15 |
| P+ | B+/BF2+ | 9.00E+14 |

FIG. 3D

| Lx (μm) | Ln (μm) | Lp (μm) | Ln, Lp, Lx | V_T (V) | I_T (mA) | V_H (V) | I_H (mA) | SECOND BREAKDOWN CURRENT (A) | mA/μm | I_leakage (A) |
|---|---|---|---|---|---|---|---|---|---|---|
| 1 | 0 | 0 | Ln = Lp = 0 | 14.51 | 52 | 5.38 | 501 | HIGHER THAN 6A | HIGHER THAN 60mA/μm | $10^{-9}$ |
| 1 | 0.3 | 0.3 | Ln + Lp = 0.6Lx | 13.40 | 55 | 5.10 | 473 | HIGHER THAN 6A | HIGHER THAN 60mA/μm | $10^{-9}$ |
| 1 | 0.5 | 0.5 | Ln + Lp = Lx | 8.27 | 43 | 4.31 | 308 | HIGHER THAN 6A | HIGHER THAN 60mA/μm | $10^{-9}$ |
| 1 | 0.8 | 0.8 | Ln + Lp = 1.6Lx | 7.03 | 38 | 4.05 | 262 | HIGHER THAN 6A | HIGHER THAN 60mA/μm | $10^{-8}$ |

| D5 (μm) | Lx (μm) | Ln (μm) | Lp (μm) | Ln, Lp, Lx | $V_T$ (V) | $I_T$ (mA) | $V_H$ (V) | $I_H$ (mA) | SECOND BREAKDOWN CURRENT (A) | mA/μ | $I_{leakage}$ (A) |
|---|---|---|---|---|---|---|---|---|---|---|---|
| 3.2 | 1 | 0.5 | 0.5 | Ln+Lp=Lx | 8.60 | 48 | 5.01 | 297 | HIGHER THAN 6A | HIGHER THAN 60mA/μ | $10^{-9}$ |
| 4.8 | 1 | 0.5 | 0.5 | Ln+Lp=Lx | 8.63 | 52 | 5.90 | 308 | HIGHER THAN 6A | HIGHER THAN 60mA/μ | $10^{-9}$ |
| 6.4 | 1 | 0.5 | 0.5 | Ln+Lp=Lx | 8.61 | 48 | 6.50 | 290 | 4.71 | 47.1mA/μ | $10^{-9}$ |
| 8.0 | 1 | 0.5 | 0.5 | Ln+Lp=Lx | 8.55 | 50 | 7.46 | 258 | 4.64 | 46.4mA/μ | $10^{-9}$ |

UN-ASSISTED, LOW-TRIGGER AND HIGH-HOLDING VOLTAGE SCR

CROSS REFERENCE TO RELATED APPLICATIONS

The present application is related and claims the benefit of priority from the provisional application, Ser. No. 60/911,133, filed on Apr. 11, 2007, and of the same title, ownership and inventorship as the present application. The above referenced provisional application is hereby incorporated herein by reference.

BACKGROUND OF THE INVENTION

1. Field of the Invention

The present invention relates silicon controlled rectifiers, SCRs, and more particularly to SCRs with controlled triggering and holding voltages.

2. Background Information

Protecting circuits from electrostatic discharges, where the protection is on the chip is an essential component for integrated circuits, especially newer, faster, smaller designs often found in very large scale integration, VLSI, circuits.

FIG. 1 illustrates a traditional bipolar SCR protection device. This device may be fabricated using standard MOS processes (hence the "gate" terminal), where the bipolar transistors are often labeled as parasitic, but it is these transistors which provide the protection. Often there are resistors from the anode to the base, R1, of T1 and one from the gate to the cathode, R2. If the gate and the cathode are at ground, the anode may rise in voltage with nothing happening but some small leakage current until the device breaks down. If a separate signal is developed that forward biases the gate to cathode, T2 will turn on which in turn turns on T1 and the device triggers presenting a low impedance from the anode to the cathode. However, it would be advantageous to not to supply this separate signal.

If the gate remains unconnected, and the voltage, VA, at the anode rises with VB at ground, VA will reach a trigger (or snap-back) voltage level, VAB, that will produce the negative resistance snap-back curve shown in FIG. 2. VA falls to the holding voltage, VH. When VAB is reached, T1 or T2 may break down and turn on the other. The net effect is that the device triggers, then T1 and T2 turn on presenting a low impedance from anode to cathode. This condition is sometimes referred to "latch up." Typically the current is limited, so the latch-up is usually not destructive.

Known problems continue to exist in the prior art circuit. For example, with an SCR across a power rail, when an ESD (Electrostatic Discharge) event occurs, the SCR may turn on, but when the event ends, the SCR may remain on, if the power rail voltage is higher than the holding voltage of the SCR. Some known SCRs turn on at voltages that are too high to fully protect low voltage ICs (integrated circuits), e.g. circuits using 3.3V or 1.8V power supplies.

Typically models have been developed to gauge and classify ESD events. The peak voltages run from about ±0.5 kV to 16 kV. Some of these models are: the HBM (Human Body Model); the MM (Machine Model); the CDM (Charged Device Model); and the IEC (International Electrotechnical Commission) model. The ESD event times for these models run from about less than ten nanoseconds rise times and decay times of about ten times as long.

Regardless of their limitations, SCRs have been among the electronic components of choice for such protection and there are many examples in the prior art. Among that prior art are: U.S. Pat. No. 6,172,404 ('404) to Chen et al. that issued on Jan. 9, 2001; U.S. Pat. No. 7,071,528 ('528) to Ker et al. that issued on Jul. 4, 2006; U.S. patent publication no. 2005/0151160 ('160) to Salcedo et al. that issued on Jul. 14, 2005; and U.S. patent publication no. 2006/0151836 ('836) to Salcedo et al. that issued on Jul. 13, 2006.

The '404 patent is silent on the trigger voltage (anode to cathode) value that is a specific characteristic in the present invention. Moreover, the '404 does not suggest the low voltage triggering and relatively high holding voltage of the present invention.

The '528 patent incorporates a three terminal device with a separate trigger signal supplied to the equivalent of the gate terminal of FIG. 1. The present invention does not suggest a three terminal device.

The '160 and the '836 publications do not suggest a trigger voltage below +13V or 15V, respectively, as compared to the +8 V trigger voltage of the present invention.

SUMMARY OF THE INVENTION

The present invention provides a two terminal protective SCR device with a low voltage trigger level and a relatively high holding voltage suitable for protecting IC circuits, in particular, low voltage power rails and low voltage circuits from ESD events Illustratively, the trigger voltage may be as low as 8V, and the holding voltage may be tuned or set to a value from about 5V to 7.5V.

Illustratively, the particular device structure and processing steps of embodiments of the present invention provide the lower voltage triggering and the higher holding voltages without involving any external circuitry and without sacrificing the ESD protection robustness when compared to prior art devices. An embodiment of the present invention provides a protective SCR having an anode and a cathode built on an N-Well and an adjoining P-Well. Both of these Wells formed above an N-type epitaxial layer built onto a p-type substrate. An ESD structure is formed bridging the N-Well and the P-Well, where the ESD structure has a higher n-type doping density than the N-Well. A PLDD structure is formed in the P-Well at a lateral distance, L1, from the ESD structure. The PLDD structure has a doping level higher than the P-Well. An N+ structure, with a length of D5, is formed in the ESD structure, and the N+ structure has a higher n-type doping density than the ESD structure. A P+ structure, with a length of L, is formed in the PLDD structure, and the P+ structure has a higher p-type doping density than the PLDD structure. The edge of the N+ structure is located at a lateral distance $L_X$ from the nearest edge of the P+ structure, where the difference between L1 and $L_X$ determines, in part, the trigger voltage and the holding voltage of the protective SCR.

When L1 is zero, the triggering voltage for the protective SCR is about 8V. Other parameters, especially a lateral length D5 of the N+ structure and a lateral length L of the P+ structure, may be varied to tune or set the holding voltage of the protective SCR, from about 5V to 7.5V, while the triggering voltage remains about constant.

The detailed construction of the "structures" mentioned herein include monolithic growth, diffusions, depositions, implants, embeddings, etc. These techniques and the required photographic steps of masking and etching, etc. are well known in the art.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which:

FIG. 3B is a table of dimensions for illustrative embodiments of the present invention;

FIG. 3C is a table of dimensions for further illustrative embodiments of one item from FIG. 3B table;

FIG. 3D is a table of illustrative doping levels;

DETAILED DESCRIPTION OF AN ILLUSTRATIVE EMBODIMENT

The above drawings and the text herein disclose a two terminal structure (no external trigger) for an SCR-type circuit with a trigger voltage as low as 8V. Moreover, the holding voltage may be tunable from about 5V to about 7.5V, while maintaining the trigger voltage essentially constant. That is, the holding voltage may be set from +5V to +7.5 volts while the trigger voltage remains at about +8V.

Figure 1:
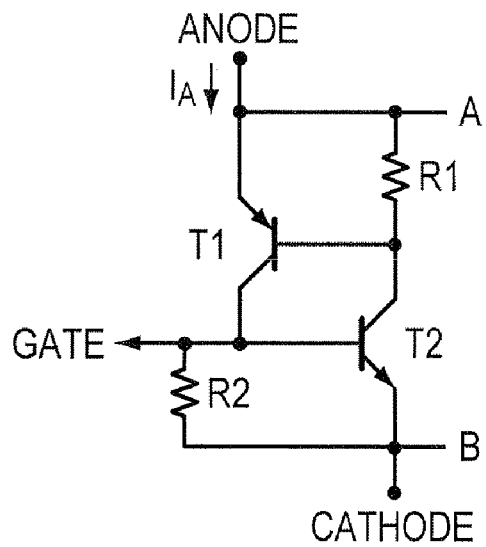
FIG. 1 is a schematic of a prior art SCR.
Figure 2:
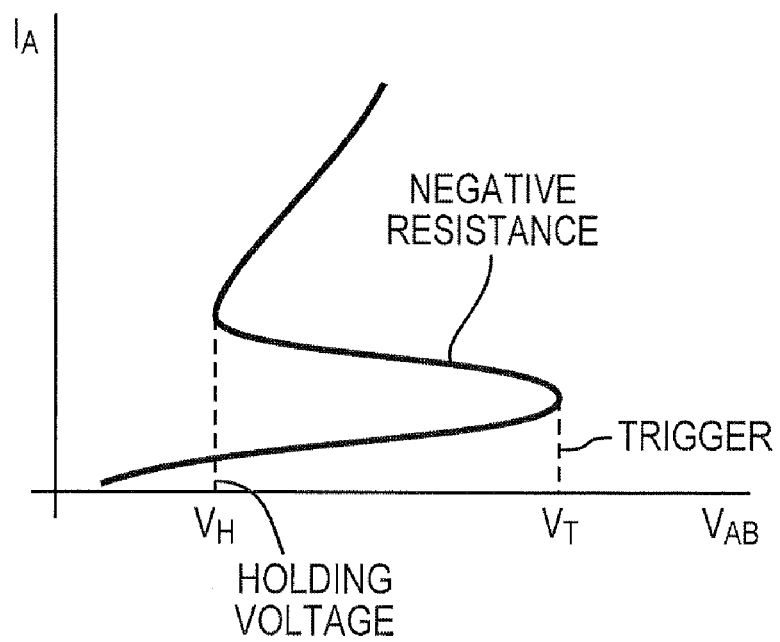
FIG. 2 is a graph of the characteristics of the FIG. 1 prior art device.
Figure 3A:
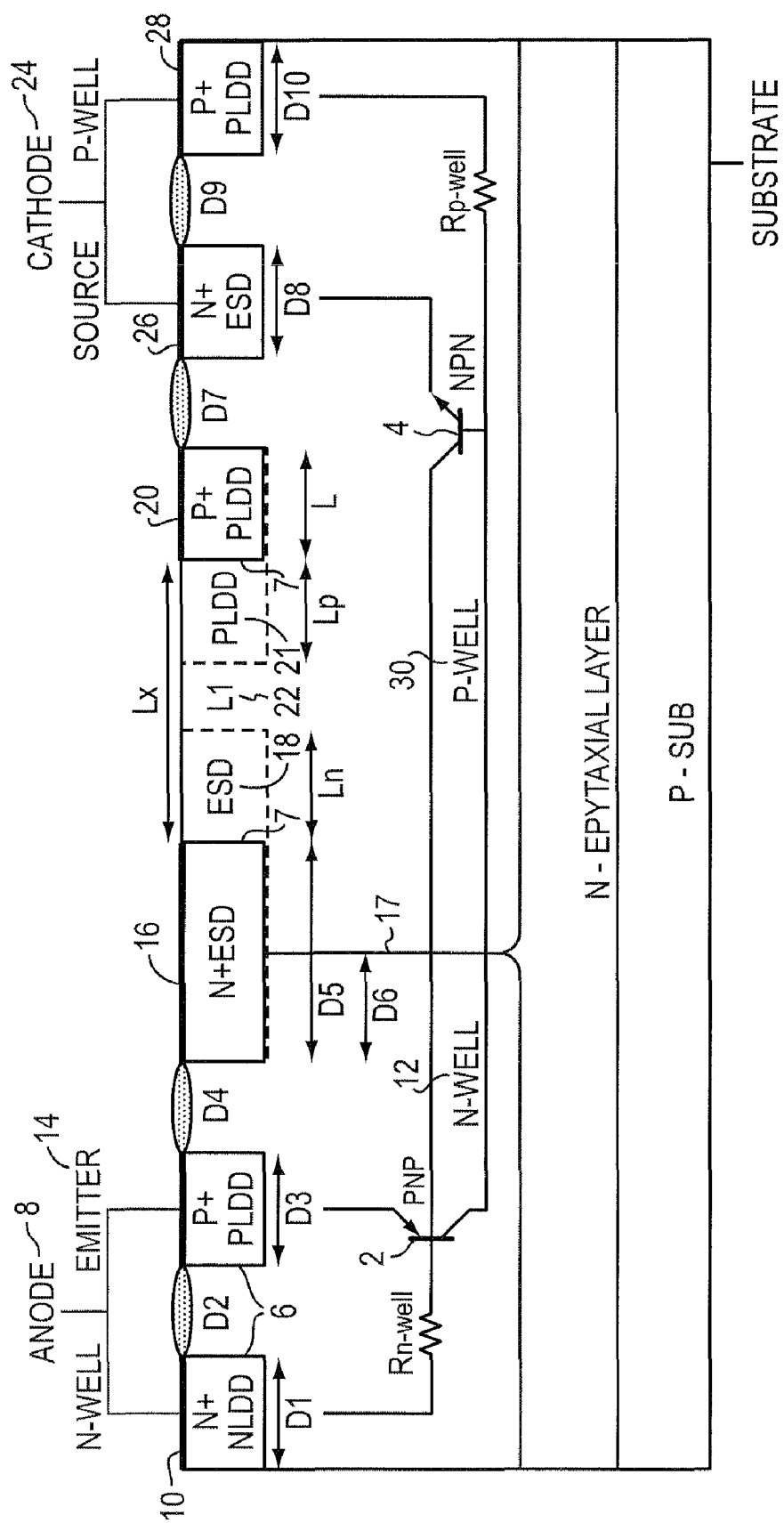
FIG. 3A is a cross section view of an IC illustrating the invention.

In FIG. 3A, a cross section of a protective device represents the bipolar PNP 2 and NPN 4 transistors approximately where they exist. Although the arrangement of the PNP 2 and the NPN 4 in FIG. 3A is similar to the schematic in FIG. 1, the differences in structure, dimensions and relative doping levels provide different advantageous characteristics. In the following descriptions, the dimensions, doping levels and materials used, the relative locations of the elements, and the resulting parameters and characteristics are illustrative. Those skilled in the art will be able to make and use the present invention by adapting the described features to their own technology. Typically doping materials include, Arsenic, Phosphorous, Boron, etc. and compounds known to those in the art.

In FIG. 3A, the NWell 10, that forms part of the Anode 8 of this illustration of the present invention, is labeled "N+/NLDD." The letters refer to a stack where a highly doped level, N+ layer, is located above an NLDD (N-type Lightly Dope Drain) with a doping level of 1/100 that of the N+ layer. The depth 6 of this N+/NLDD layer 10 and the P+/PLDD layer 14 may be about 0.14 μm or so. The EMITTER 14 forms the other part of the Anode 8 is labeled P+/PLDD. The letters refer, as before, to a high doping level. P+ layer, is located above a PLDD (P-type Lightly Doped Drain), where again the doping difference is about 1/100, respectively.

An ESD region 18 is placed bridging the N-Well 12 and the P-Well 30, and an N+ 16 layer represents a highly doped N-type region formed in the less highly (1/10) doped ESD region 18. The lateral dimension D5 of the N+ layer 16 may vary from about 3 to as much as 8 μm and bridges the N-Well, P-Well junction. The N+ layer 16 is separated by the distance Lx from a highly doped P+ layer 20 that is formed in the less highly (1/10) PLDD region 21. The lateral dimension L of the P+ layer 20 may vary from 1.6 μm to 3.2 μm. Illustratively, the depth of the ESD regions 18 and the PLDD region 21 may be about 0.19 μm. In this embodiment, the distance Lx illustratively is about 1 μm, and comprises the distance Ln, a space 22 and the distance Lp. These distances, Lx, Ln, Lp, D5, and L may be selected to determine the trigger voltage and the holding voltage of the protective device.

The stacks at the Cathode 24, include the N+/ESD structure 26 and the P+/PLDD structure 28. These stack structures are similar to those described above for the Anode.

The field oxide at Lx area is removed and replaced by silicide blocking mask for a fully salicided process. The PLDD mask is stretched toward the N+ and the ESD mask is stretched toward the P+ area. When the two masks (the ESD 18 and the PLDD 21) come very close or touch, the ESD/PLDD junction replaces or takes over from the N+/P+ Well junction 17 (FIG. 3A) and becomes the dominant blocking junction. Since the depletion region width of the ESD/PLDD junction is smaller than that of the N+/P+ Well junction 17 and will breakdown at a smaller reverse voltage. The trigger voltage of the inventive SCR (SCR and SCR structure are used interchangeably) highly depends on the breakdown voltage of the dominant blocking junction and its values are shown in the following figures and tables. The geometric distances Ln and Lp control how close these masks come to each other, and when they touch the distance Lx=Ln+Lp. Some of the parameters shown depend on the width (the dimension orthogonal to the plane of the cross section view of FIG. 3A) of the illustrated device which is about 100 μm.

Still referring to FIG. 3A, when the trigger voltage is reached the blocking junction experiences an avalanche breakdown at which time the NPN/PNP bipolar transistors (shown in the figures) are turned on by forward biasing the bases due to the voltage drops across the parasitic resistances Rn-well and Rp-well. The configuration of the NPN and PNP form a regenerative feedback circuit that turns on the inventive SCR. With respect to FIG. 3A, the holding voltage (the voltage across the SCR when it is on) may be increased by principally increasing D5, although increasing L and decreasing D3 and D8 have an effect. By manipulating these parameters, the holding voltage of +5V and higher can be designed or tuned into the SCR. This level is important because, if the circuitry being protected has a supply voltage of 3.3V or 1.8V, the SCR holding voltage must be greater than the supply voltage to ensure the SCR turns off when the ESD transient (that triggered the SCR) dissipates.

FIG. 3B is a table of dimensions of a illustrative embodiments of the present invention. As can be seen the Ln and Lp dimensions are changed from item 50 to item 56. The traces in FIG. 4 and the characteristics of FIG. 5 relate to the specific examples in the table of FIG. 3B.

FIG. 3C is a table of dimensions of a illustrative embodiments of item 54 in the table FIG. 3B. Here, Lx=Ln+Lp for all itmes 70, 72, 74 and 76, but the dimension of L increases to 3.2 μm and the dimension of D5 changes from 3.2 μm to 8.0 μm. The traces in FIG. 6 and the characteristics of FIG. 7 relate to the specific examples in the table of FIG. 3C.

Figures 4, 5:
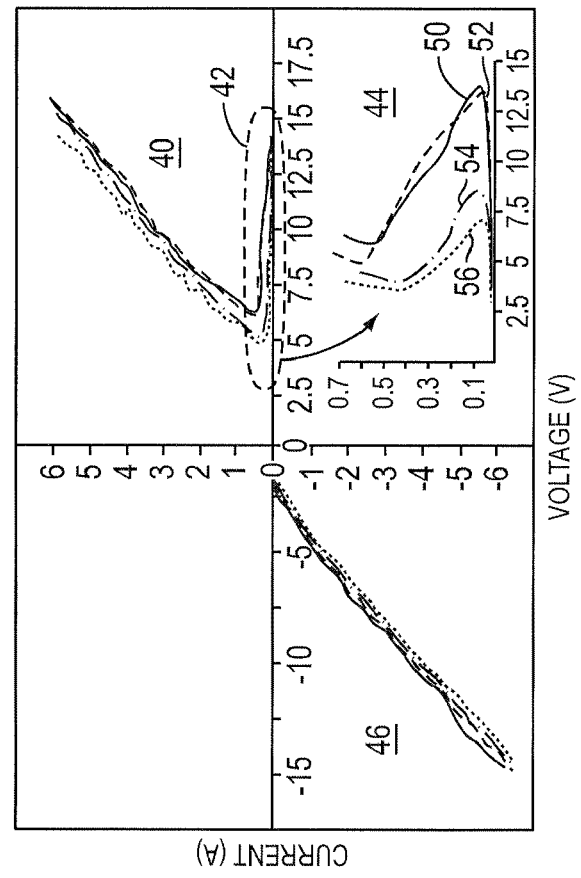
FIG. 4 are graphs of trigger voltages and holding voltages for the illustrative devices from the FIG. 3B table.
FIG. 5 is a table of some dimensions and characteristics of the devices illustrated in FIG. 3B and FIG. 4.
Figures 6, 7:
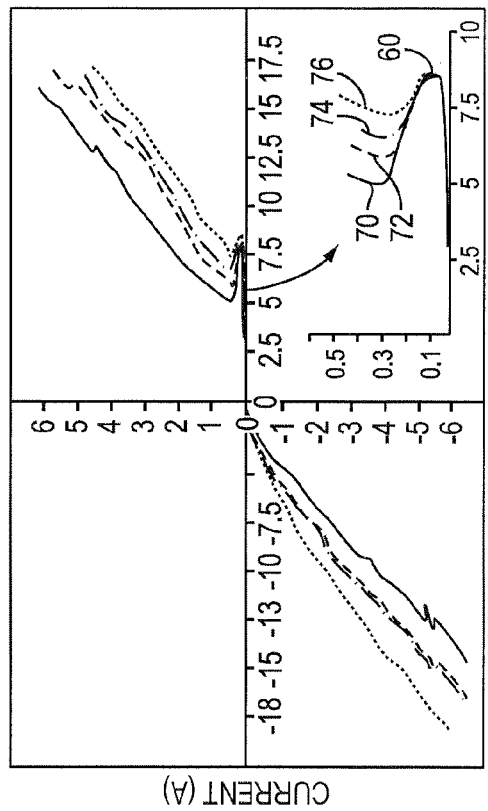
FIG. 6 are graphs of trigger voltages and holding voltages for the illustrative devices from the FIG. 3C table.
FIG. 7 is a table of some dimensions and characteristics of the devices illustrated in FIG. 3C and FIG. 6.

Note the traces shown in the FIGS. 4 and 6 are generated via transmission line pulsing (TLP) I/V (current/voltage) as known to those skilled in the art.

FIGS. 4 and 5 together illustrate the effects of varying the relative dimensions of Ln and Lp when Lx is held at 1 μm. The traces 40 illustrates the general characteristics of four two terminal protective devices made in accordance with the present invention. The four devices have trigger voltages of about 7V to about 14V and holding voltages of about 4V to 5V. The traces 44 illustrate the traces from 40 in the small area 42 bounded by about current and 15V voltage. Trace 46 shows the reverse characteristics, that are not discussed herein, but may have relevance if ESD events include significant overshoots, oscillations and high reverse voltages.

The table, FIG. 5, depicts four devices where the distances Ln and Lp relative to Lx produce ESD protective devices with significant differences. The trace in graph 44 marked 50 represents the triggering and holding voltage for the device marked 50 in FIG. 5. Here, Ln and Lp are zero and the trigger voltage, VT, is 14.51V and the holding voltage, VH, is 5.38V. Device 52, where Lx is 1 μm and Ln and Lp are 0.3 μm, VT is 13.4V and VH is 5.10V. Device 54, where Ln and Lp are 0.5 μm and meet each other, VT is 8.27V and VH is 4.31V. Device 56 where Ln and Lp are 0.8 μm and overlap each other, VT is 7.03V and VH is 4.05V, but the leakage current 58 has increased by an order of magnitude.

In FIG. 5, the robustness of ESD protection 79 for each device may be higher than 60 mA/μm. The proximity of the N+ 16 and the P+ 20 (see FIG. 3A) regions, the physical dimensions and their doping levels provide this increased current density 79. A current density of 60 mA/μm in a device when a width (again the dimension of the device normal to the two dimensional drawing of FIG. 3A) of 100 μm means the device can handle 6 A of current. In the embodiments of the present invention, this 6 A converts to about 9 kV of HBM ESD protection.

Thus, second breakdown failure current for the SCRs examples shown herein are all higher than 6 A, that implies protection against high voltage levels of ESD events (kV). Also, leakage currents are low (one nanoamp). The slope of the turn on trace is fairly independent of the parameters, and the devices are fabricated with one finger (see prior art devices in the references disclosed herein). The turn on resistances will be lowered (improved) using multi-finger designs.

FIGS. 6 and 7 illustrate additional characteristics of the device 54 from FIG. 5. The four examples in FIG. 6 and 7 have Ln and Lp at 0.5 μm with $L_X$ of 1.0 μm and L of 3.2 cm. That is the edge of the ESD structure 18 is touching the edge of the PLDD 21. Note that the trigger voltages indicated by 60 and from the table of FIG. 7 are all about constant at 8.6V, while the VH are different. Here VH is tuned from +5.01V to +7.46V as D5 (the lateral length of item 16 from FIG. 3A) is changed from 3.2 μm to 8.0 μm. As mentioned above, changing D5, L, D3 and D8 affect VH, but the width of D5 predominates. A heuristic approach may be used to tune or design the VH for a specific application.

As shown, increasing D5 may increase "on" resistance of the device because the current path may become longer. This tends to degrade the device, but as mentioned just above, a multi-finger design will solve this limitation.

Figure 8:
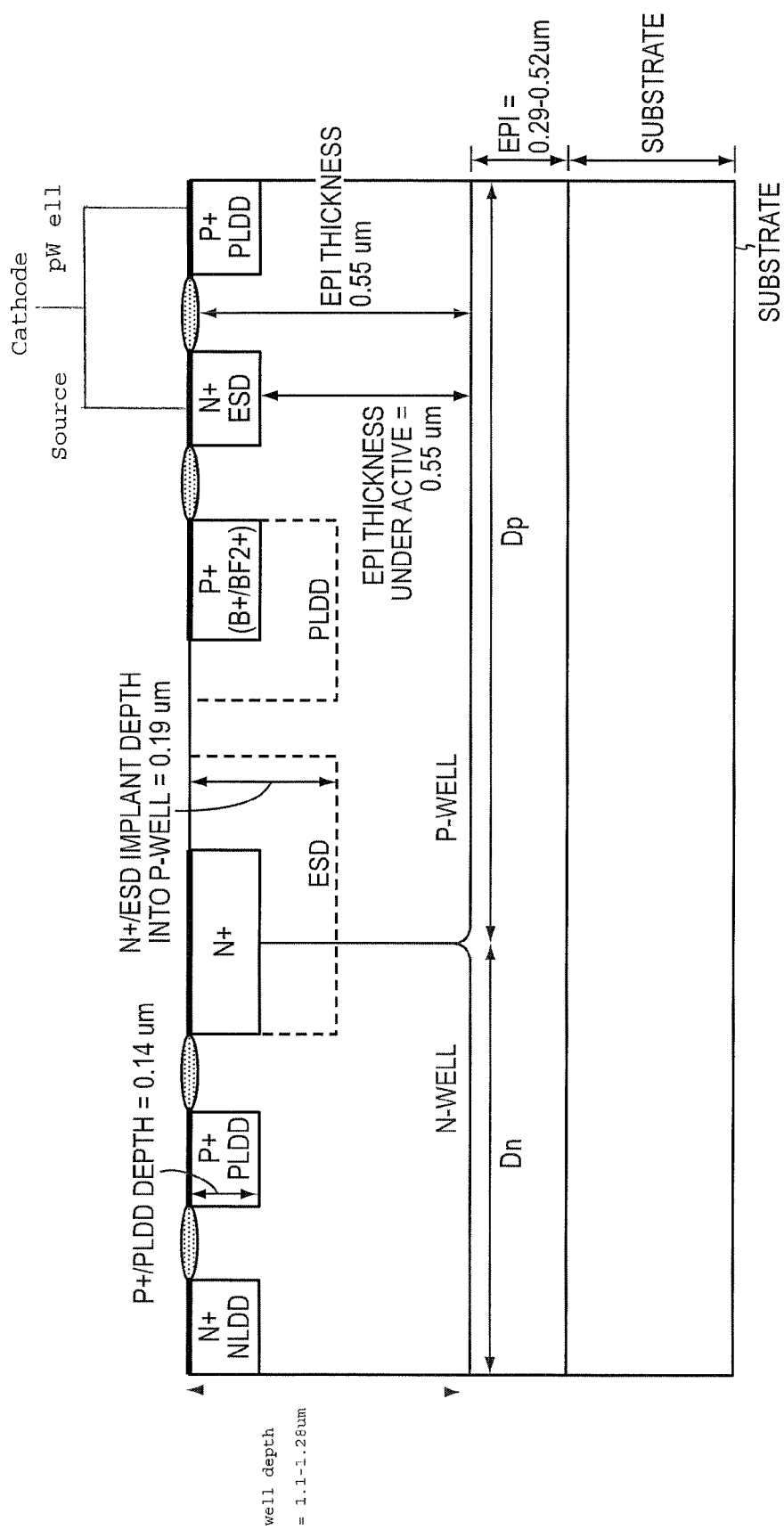
FIG. 8 is a cross section view of an embodiment of the invention illustrating some physical dimensions.

FIG. 8 shows some vertical dimensions of one embodiment of the invention that better illustrates details that may be helpful for understanding the invention to those skilled in the art.

It will be appreciated by those skilled in the art that although the following Detailed Description will proceed with reference being made to illustrative embodiments, and methods of use, the present invention is not intended to be limited to these embodiments and methods of use. Rather, the present invention is of broad scope.

What is claimed is:

1. A protective device comprising:
   an N-Well (12) and an adjoining P-Well (30);
   a first p-type structure (14) formed in the N-Well, the first p-type structure providing an emitter, the N-Well a base and the P-Well a collector of a PNP bipolar transistor, wherein the emitter and the base together form an anode of the protective device;
   a first n-type structure (26) formed in the P-Well, the first n-type structure providing an emitter, the P-Well a base and the N-Well a collector of an NPN bipolar transistor, wherein the emitter and the base together form a cathode of the protective device;
   an ESD structure (18) formed bridging the N-Well and the P-Well, the ESD structure having a higher n-type doping density than the N-Well;
   a PLDD structure (21) formed in the P-Well at a lateral distance, L1, from the ESD structure (18), the PLDD structure having a doping level higher than the P-Well;
   an N+ structure (16) formed in the ESD structure, the N+ structure (16) having a higher n-type doping density than the ESD structure (18);
   a P+ structure (20) formed in the PLDD structure, the P+ structure (20) having a higher doping density than the PLDD structure, wherein an edge of the N+ structure (16) is at a lateral distance LX from the nearest edge of the P+ structure (20);
   wherein the difference between L1 and LX determines, in part, the breakdown voltage and the holding voltage of the protective device.

2. The protective device of claim 1 wherein L1 is zero, wherein the trigger voltage for the protective device is about constant.

3. The protective device of claim 1 wherein the first p-type structure (14), the emitter of the PNP transistor, comprises a first stack comprising a P+ structure formed in a PLDD structure, and the first n-type structure (26), the emitter of the NPN transistor, comprises a second stack comprising an N+ structure formed in an ESD structure.

4. The protective device of claim 1 wherein the N+ structure (16) defines a lateral dimension D5, wherein when dimension L1 is about zero, the holding voltage of the protective device may be controlled by the lateral dimension D5.

5. The protective device of claim 1 wherein the robustness of ESD protection from the anode to the cathode when the protective device is triggered may be more than about 60 mA/μm.

6. A method for protecting circuits, the method comprising the steps of:
   forming an N-Well (12) and an adjoining P-Well (30);
   in the N-Well forming a first p-type structure (14), the first p-type structure providing an emitter, the N-Well a base and the P-Well a collector of a PNP bipolar transistor, wherein the emitter and the base together form an anode of a protective device;
   in the P-Well forming a first n-type structure (26), the first n-type structure providing an emitter, the P-Well a base and the N-Well a collector of an NPN bipolar transistor, wherein the emitter and the base together form a cathode of the protective device;
   forming an ESD structure (18) bridging the N-Well (12) and the P-Well (30), the ESD structure (18) having a higher n-type doping density than the N-Well;
   forming a PLDD structure (21) in the P-Well at a lateral distance, L1, from the ESD structure (18), the PLDD structure (21) having a higher doping level than the P-Well;

forming an N+ structure (16) in the ESD structure (18), the N+ structure (16) having a higher n-type doping density than the ESD structure (18);

forming a P+ structure (20) in the PLDD structure (21), the P+ structure (20) having a higher doping density than the PLDD structure, wherein an edge of the N+ structure is at a lateral distance LX from the nearest edge of the P+ structure, wherein the difference between L1 and LX determines, in part, the breakdown voltage and the holding voltage of the protective device.

7. The method of claim 6 further comprising the steps of controlling the holding voltage of the protective device by varying the lateral dimension D5 of the N+ structure (16), where when the lateral distance L1 is about zero.

8. A protective SCR defining an anode and a cathode, the protective SCR built on an N-Well and an adjoining P-Well, the protective SCR comprising:

an ESD structure (18) formed bridging the N-Well and the P-Well, the ESD structure having a higher n-type doping density than the N-Well;

a PLDD structure (21) formed in the P-Well at a lateral distance, L1, from the ESD structure, the PLDD structure having a doping level higher than the P-Well;

an N+ structure (16) formed in the ESD structure (18), the N+ structure having a higher n-type doping density than the ESD structure;

a P+ structure (20) formed in the PLDD structure (21), the P+ structure (20) having a higher p-type doping density than the PLDD structure (21), wherein an edge of the N+ structure is at a lateral distance LX from the nearest edge of the P+ structure;

wherein the difference between L1 and LX determines, in part, a breakdown voltage and a holding voltage of the protective SCR.

9. The SCR of claim 8 wherein L1 is zero.

10. The SCR of claim 8 wherein the PLDD doping dose and the NLDD doping dose are both about 4.00E+13, and the N+ doping dose is about 1.14E+15 and the P+ doping dose is about 9.00E+14.

\* \* \* \* \*